March 31, 1970 A. N. DUMANEVICH ET AL 3,504,241

SEMICONDUCTOR BIDIRECTIONAL SWITCH

Filed March 6, 1967 4 Sheets-Sheet 1

United States Patent Office 3,504,241

Patented Mar. 31, 1970

3,504,241

SEMICONDUCTOR BIDIRECTIONAL SWITCH

Anatoly Nikolaevich Dumanevich, Ul. Ostrovskogo 24, kv. 1, Ramensky raion p/o Udelnaya, Moskovskaya oblast, U.S.S.R.; Jury Alexeevich Evseev, Ul. Rubinshteina 4, kv. 14, Leningrad, U.S.S.R.; Valentina Stefanovna Vasilenko, Ul. Sovetskaya 33, kv. 14, Saransk, U.S.S.R.; and Vladimir Maximovich Tuchkevich, Ul. Lenina 25, kv. 6, and Valentin Evgenievich Chelnokov, Ul. Karpinskogo 40, korp. 8, kv. 80, both of Leningrad, U.S.S.R.

Filed Mar. 6, 1967, Ser. No. 620,961

Int. Cl. H01l *11/00, 15/00*

U.S. Cl. 317—235 6 Claims

ABSTRACT OF THE DISCLOSURE

Semiconductor bidirectional switches are intended to be used in different converters of electrical energy, namely, in rectifiers with reversals of current, converters of electrical power for reversable electrodrives, and similar uses, and they comprise a semiconductor multi-layer structure preferably N-P-N°-P-N type conductivity with shunts of the emitter junctions with only one superposed area of the shunts.

The present invention relates to semiconductor devices, more particularly, to symmetrical silicon controlled rectifier elements and may find application in static converters of electric energy, namely, in rectifiers with systems for non-contact control and reversing of the rectified current, in controlled electrical drives, inverters, etc.

Symmetrical thyristors are known which employ a five-layer structure in which the emitter junctions of the upper and lower layers are of the tunnel type or the P and N-type conductivity layers pass to the contacts of the current terminals, which will hereafter be called "shunts." Control of the direct and inverse branches of the volt-ampere characteristic of these devices is effected either through two control electrodes connected to thin bases or through one control electrode connected to a thick base. When the device is controlled by two electrodes, the current pulse in the control circuit is applied between the control electrode and the cathode, for each direction of load current individually which requires two control units are necessary. When the control electrode is connected to the thick base, the current pulse is applied between this electrode and the anode. In this case, a control unit is also required for each direction of load.

A disadvantage of the available conventional symmetrical thyristor is that it requires two control units.

An object of the present invention is to overcome the above disadvantage.

Another object of the present invention is to provide an efficient and reliable symmetrical thyristor.

With these and other objects in view, the shunts are so disposed in an N–P–N°–O–P–N-type conductivity multilayer structure of a symmetrical thyristor in which the starting material of the structure is designated by N° that, according to the invention, the orthogonal projections of the opposite-conductivity layers of the shunts coincide, and one of these shunts is provided with a control electrode surrounded by a layer the conductivity of which is opposite to that of the control electrode, said electrode being positioned on the line of contact of the opposite-conductivity layers of the shunt.

In accordance with one embodiment of the invention the control electrode is positioned on the line of contact of the opposite-conductivity layers of the shunt, said line being the symmetry axis of said shunt.

According to another embodiment of the invention the

N-type and P-type conductivity layers of the shunts and the control electrode are made circular and the areas of the N-type and P-type conductivity layers are equal.

In these cases the control electrode has one-type conductivity.

The control electrode may be manufactured in the form of two equal-area adjacent sectors of N-type and P-type conductivity layers, the orthogonal projections of each of which cover the projections equal to them in area of the N-type and P-type conductivity layers of the shunt, which are opposite to the shunt with the control electrode.

The control electrode may consist of four equal-area adjacent sectors of opposite-conductivity layers. In this case, the orthogonal projections of the one-type conductivity layers of the control electrode cover in pairs the orthogonal projections equal to them in area of the opposite-conductivity layers of the shunt, which is opposite to that with the control electrode.

In order to control current of any polarity, it is advisable to use a symmetrical thyristor with a control electrode consisting of two adjacent sectors of the layers of opposite conductivity, since a symmetrical thyristor with a control electrode having four sectors of opposite conductivity requires heavy control currents.

The five-layer structure of the present invention features a controlled switching volt-ampere characteristic symmetrical relative to the origin of coordinates.

For a better understanding of the present invention, reference is made to the following description taken in connection with the accompanying drawings, in which.

The symmetrical thyristor with unipolar control is a multilayer structure 1 (FIG. 1) of N–P–N°–P–N type conductivity.

Figure 2:
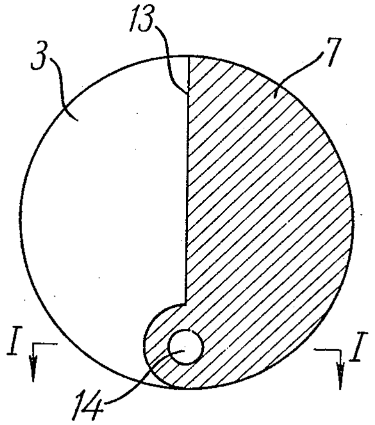
FIG. 2 is a reduced size top plan view of the unipolar-control symmetrical thyristor shown in FIG. 1 without the power electrode (the orthogonal projection of the upper shunt)
Figure 3:
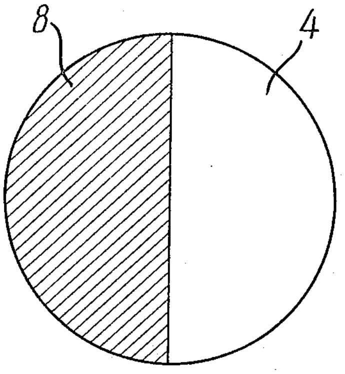
FIG. 3 is a reduced size view of the underside of the symmetrical thyristor with unipolar control shown in FIG. 1, without the power electrode.

The thyristor is built around a monocrystal plate of N-type conductivity with specific resistance of 40 ohm/cm. and a diffusion length of 0.3 mm. Acceptor and donor impurities are diffused into this plate and form a multilayer structure. The multilayer structure has an N-type conductivity layer 2 (FIG. 1) of parent silicon, P-type conductivity layers 3, 4, which form P–N junctions 5, 6 at the depth of 70–80 microns, and N-type conductivity layers 7, 8, which form P–N junctions 9, 10 at the depth of 10–15 microns. The P-type and N-type layers 3, 4, 7, 8 of this structure extend into contact with the current terminals 11, 12. When the orthogonal projections of the shunts are superposed, for example, when the orthogonal projection of the layers 3 and 7 (FIG. 2) is superposed on the orthogonal projection of the layers 8 and 4 (FIG. 3) they are overlapped by the regions of opposite conductivity: the N-type conductivity layer 7 overlaps the P-type conductivity layer 4 and the P-type conductivity layer 3 overlaps the N-type conductivity layer 8, said layers being in contact with each other along the symmetry axis 13, and only in the region adjacent to the control electrode 14, a small portion of the orthogonal projection of the N-type layer 7 (FIG. 2) of the upper shunt overlaps the orthogonal projection of the N-type layer 8 (FIG. 3) of the lower shunt.

The centre of the control electrode is positioned on the symmetry axis 13 which is the line of contact of the layers 3, 7 (FIG. 2) of P-type and N-type conductivity. The power electrodes 15, 16 (FIG. 1) are attached to the contacts 11, 12 while the leadout lead 18 of the control electrode 14 is connected to this electrode through a nickel contact 17.

Figure 1:
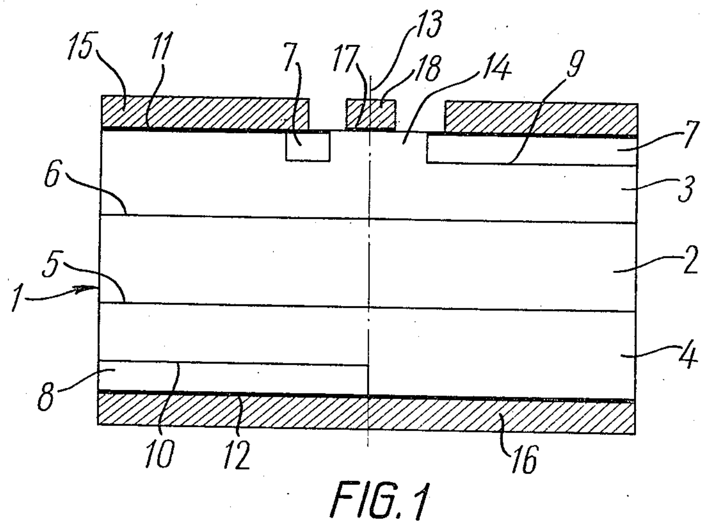
FIG. 1 is an enlarged sectional view along line I—I of FIG. 2, showing the multilayer structure of a symmetrical thyristor with unipolar control.

The symmetrical thyristor with unipolar control operates as follows. When a positive potential is applied to the power electrode 15 is and a negative one is supplied to the power electrode 16, the P-N junction 9 is biased in the inverse direction and, when in the conducting state, the current flows through the left-hand (relative to the symmetry axis 13) portion of the multilayer structure 1 (FIG. 1). If the voltage source in the control circuit is so connected that the plus is applied to the control electrode 14 and the minus is applied to the power electrode 15 the P-N junction 9 is biased in the conducting direction and starts to inject electrons into the region 2, and the action of these electrons would be the same as if the control electrode was connected to said region 2.

When the polarity of the power electrodes is reversed, the current flows through the right-hand (relative to the symmetry axis 13) portion of the structure 1 and the symmertical thyristor is controlled as a conventional thyristor.

Figure 8:
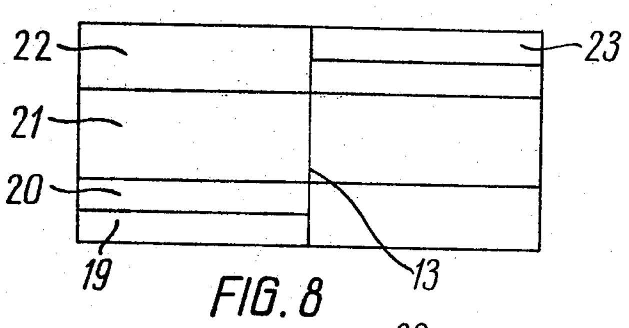
FIG. 8 shows the disposition of the layers of the multilayer structure of the symmetrical thyristor, section along VIII—VIII of FIGS. 6 and 9.
Figure 9:
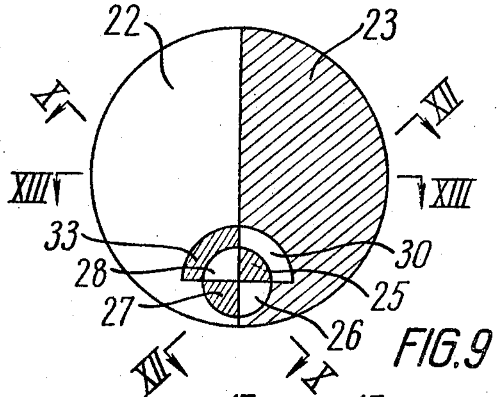
FIG. 9 is a symmetrical thyristor controlled by a current of any polarity with a control electrode of four equal-area adjacent sectors with the layers of different-type conductivity (the orthogonal projection of the upper shunt; power electrodes are not shown)
Figure 10:
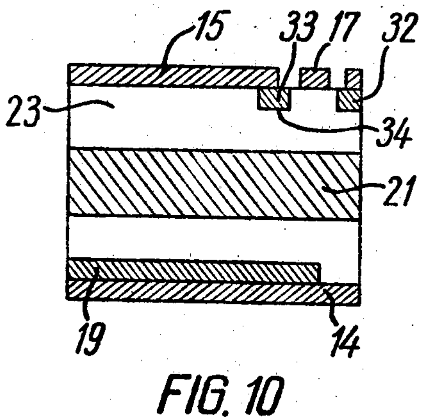
FIG. 10 shows the multilayer structure of the symmetrical thyristor, section along X—X of FIG. 9.
Figure 12:
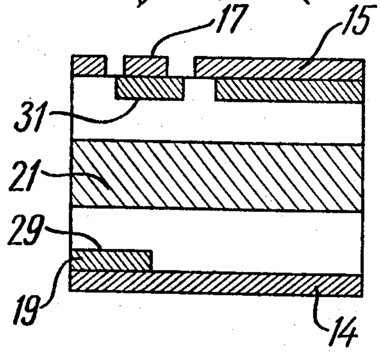
FIG. 12 shows the multilayer structure of the symmetrical thyristor, section along XII—XII of FIG. 9.

The symmetrical thyristor controlled by a current of any polarity is an N-P-N°-P-N type structure (FIGS. 8, 10 and 12). The structure, which is not adjacent the control electrode, comprises an N-type layer 19, a P-type layer 20, an N°-type layer 21, a P-type layer 22 disposed one above the other in the left-hand (relative to the symmetry axis 13) portion of the structure (FIG. 8) and a P-type layer 20, an N-type layer 21, a P-type layer 22, an N-type layer 23 located in the right-hand portion of the structure. The orthogonal projections of the layers 22 and 23 (FIG. 9) of the upper shunt are symmetrical and their areas are equal. The control electrode 24 positioned on the axis 13 (which is the line of contact of the above projections) is made in the form of a circle divided into four equal sectors 25, 26, 27, 28 each surrounded by a region of opposite conductivity, for example, the sector 26 of P-type conductivity is surrounded by the N-type conductivity sectors 25, 27 of the control electrode and by a portion of the N-type conductivity layer 23.

Figure 11:
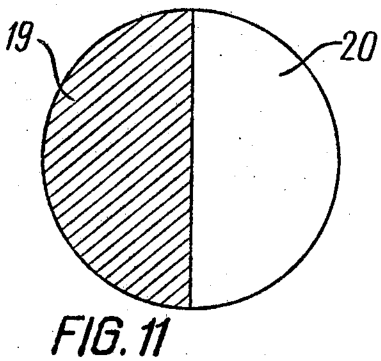
FIG. 11 is a symmetrical thyristor controlled by current of any polarity in which the control electrode has four equal-area adjacent sectors with the layers of different-type conductivity (bottom view; power electrodes are not shown)

The N-type layer 19 (FIG. 11) and the P-type layer 20 of the lower shunt are symmetrical relative to the line of contact and are equal in area.

The symmetrical thyristor controlled by a current of any polarity operates as follows. When a negative potential is applied the power electrode 15 (FIG. 12) and positive potential is applied the electrode 14, the P-N junction 29 is biased in the inverse direction and while in the conducting condition the current will flow through the right-hand portion of the structure (FIG. 8); in this case the section 30 (FIG. 9) is under negative potential. When the voltage source in the control circuit is connected so that the minus is applied to the control electrode 17 (FIG. 12) and the plus is applied to the power electrode 15, then at a certain value of the control current, the sector 25 (FIG. 9) of the control electrode 24 begins to inject electrons in to the base region 21 through the right-hand edge of the P-N junction 31 (FIG. 12). In this case, the structure is rendered conductive first through the control electrode 24 (FIG. 9) and then through the main emitter.

If the polarity in the control circuit is reversed, the P-N junction 32 (FIG. 10) injects electrons through the left-hand edge. In this case, the control medium is similar to that of a conventional controlled rectifier. If a positive potential is applied to electrode 15 and a negative one to electrode 14 the P-N junction 32 is biased in the inverse direction and when in the conducting condition the curent will flow through the left-hand (relative to the symmetry axis 13) portion of the structure (FIG. 8). When the voltage source in the control circuit is connected so that the negative potential is applied to the leadout of the control electrode 17 and the positive potential is applied to the power electrode 15 the sector 27 (FIG. 9) the left edge of the P-N junction 31 (FIG. 12) begins to inject electrons into the base region 21 (FIG. 12) through the left edge of the P-N junction 31 (FIG. 12), and the action of these electrons would be the same as if the control electrode were connected to said region. When the polarity in the control circuit is, the region 33 (FIG. 9) plays a similar role, i.e. the P-N junction 34 (FIG. 10) injects electrons through the right-hand portion into the base region 21. In this case, a five-layer structure should be realized under the injector region 33.

Figure 4:
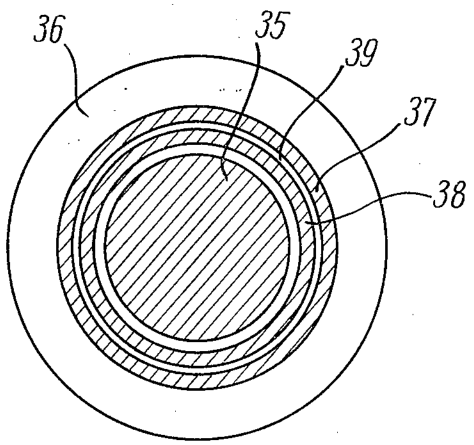
FIG. 4 is a symmetrical thyristor controlled by a current of any polarity with the N-type and P-type conductivity layers of the shunts, and the control electrode made circular (the orthogonal projection of the upper shunt: power electrodes are not shown)
Figure 5:
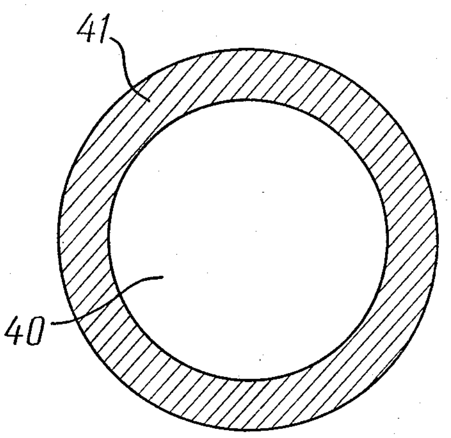
FIG. 5 is a symmetrical thyristor controlled by a current of any polarity with the N-type and P-type conductivity layers of the shunts, and the control electrode made circular (the orthogonal projection of the lower shunt; power electrodes are not shown)

The symmetrical thyristor controlled by a current of any polarity may have a control electrode consisting of concentric rings. In this case, the upper shunt of the symmetrical thyristor has an N-type conductivity layer 35 (FIG. 4), and a P-type conductivity layer 36 formed as equal-area concentric rings, on the line of contact of which there is positioned a control electrode comprising N-type concentric rings 37, 38 and a P-type ring 39. The lower shunt has a P-type conductivity layer 40 and an N-type conductivity layer 41, whose areas are equal. When the orthogonal projections of the shunts are superposed they are overlapped by the regions of opposite conductivity.

Figure 6:
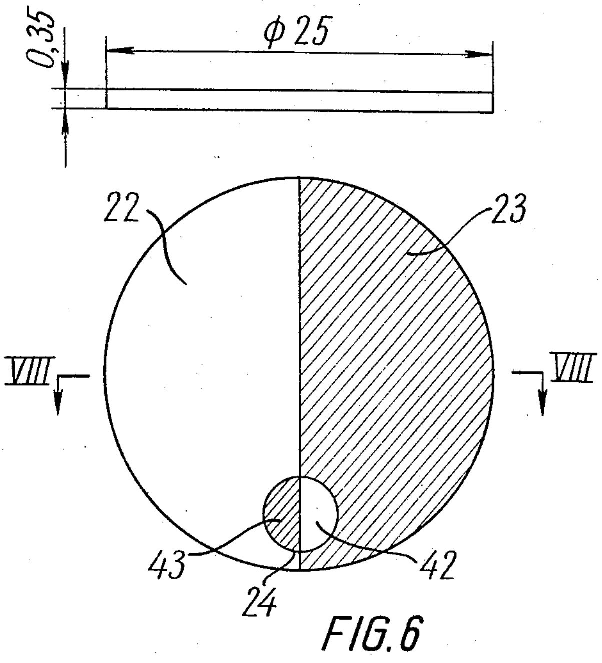
FIG. 6 is a symmetrical thyristor controlled by a current of any polarity, in which the control electrode is divided into two equal-area adjacent sectors with the layers of N-type and P-type conductivity; (the orthogonal projection of the upper shunt; power electrodes are not shown)

The symmetrical thyristor controlled by a current of any polarity may also be provided with a control electrode divided into two halves of opposite conductivity. In this case the upper shunt of the symmetrical thyristor has a P-type conductivity layer 22 (FIG. 6) and an N-type conductivity layer 23 located symmetrically relative to the diameter and having equal areas. The control electrode 24 positioned on the line of contact of these layers consists of two adjacent equal-area layers 42, 43 of N- and P-type conductivity, each of these layers being surrounded by the layers 22, 23 of opposite conductivity.

Figure 7:
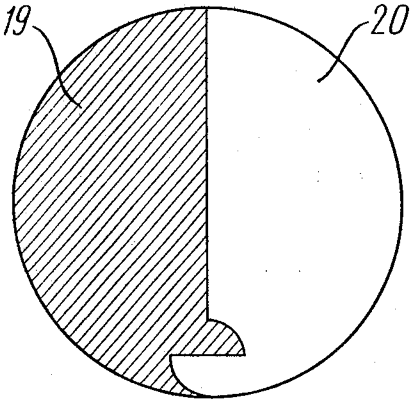
FIG. 7 is a symmetrical thyristor controlled by a current of any polarity, in which the control electrode is divided into two equal-area adjacent sectors with the layers of N-type and P-type conductivity (the orthogonal projection of the lower shunt; power electrodes are not shown;)

The lower shunt of the symmetrical thyristor (FIG. 7) with a control electrode divided into two halves consists of two opposite-conductivity layers, namely the P-type layer 20 and the N-type layer 19. When the orthogonal projection of one shunt is superposed on that of the other they are overlapped by the regions of opposite conductivity; half of the P-type region 42 (FIG. 6) of the control electrode 24 overlaps the N-type region 19 (FIG. 7) of the lower shunt, and half of the N-type region 43 (FIG. 6) of the control electrode overlaps the P-type region 20 (FIG. 7) of the lower shunt. For this purpose the lower shunt is provided with a S-shape protrusion of the N-type region 19 into the P-type region 20 and of the N-type region 19.

When realized, the present invention enables the production of power thyristors for load currents of 500 a. and higher. The direct and inverse branches of the volt-ampere characteristic may be controlled by unipolar, bipolar and different-polarity current pulses. When the symmetrical thyristor is controlled by bidirectional and different-polarity pulses, the control is effected in both directions by a current of the same order.

Application of this invention affords considerable savings of the expensive starting material.

We claim:

1. A semiconductor bidirectional switch based on a plate having multi-layer structure, preferably N–P–N°–P–N type conductivity, comprising current leads arranged on both sides of said plate and shunting the emitter junctions of said structure, said shunts of emitter junctions of the external layers being arranged such that orthogonal projections to said current leads of P-type conductivity layers have a common contact line with said shunts; the orthogonal projections of N-type conductivity layers of said structure have only one superposing area arranged near the control electrode; the center of the control electrode is on the prolongation of the line dividing the opposite type conductvities, and opposite type conductivity semiconductor extends laterally around said control electrode in contact therewith.

2. A semiconductor bidirectional switch according to claim 1, in which said control electrode is positioned on the line of contact of the opposite conductivity layers, said line being a symmetry axis of said shunts.

3. A semiconductor bidirectional switch according to claim 1, in which the opposite conductvity layers of said shunts and the control electrode are made as rings, and said opposite conductivity layers are equal in area.

4. A semiconductor bidirectional switch according to claim 1, in which said control electrode is a layer of one-type conductvity.

5. A semiconductor bidirectional switch according to claim 2, in which the control electrode has two equal-area adjacent sectors of opposite conductivity, the orthogonal projections of each of which cover the projections equal to them in area of the N-type and P-type conductivity layers of the shunt which is opposite to that with said control electrode.

6. A semiconductor bidirectional switch according to claim 1, in which the control electrode has four equal-area adjacent sectors of the N-type and P-type conductivity layers, the orthogonal projections of the layers of the P-type conductivity sectors and of the N-type conductivity layers of the control electrode covering in pairs the orthogonal projections of the layers of the N-type and P-type conductivity sectors of the shunt which is opposite to that with the control electrode.

References Cited

UNITED STATES PATENTS

| | | | |
|---|---|---|---|
| 3,196,330 | 7/1965 | Moyson | 317—235 |
| 3,343,048 | 9/1967 | Kuehn et al. | 317—235 |
| 3,409,810 | 11/1968 | Matzen | 317—235 |
| 3,435,302 | 3/1969 | Suzuki et al. | 317—235 |
| 2,993,154 | 7/1961 | Goldey et al. | 317—235 |
| 3,078,196 | 2/1963 | Ross | 317—235 |
| 3,256,470 | 6/1966 | Gerlach | 317—235 |
| 3,328,652 | 6/1967 | Sylvan | 317—235 |
| 3,350,611 | 10/1967 | Scace | 317—235 |
| 3,372,318 | 3/1968 | Tefft | 317—235 |
| 3,391,310 | 7/1968 | Gentry | 317—234 |

JOHN W. HUCKERT, Primary Examiner

A. J. JAMES, Assistant Examiner

U.S. Cl. X.R.

317—234